US012665500B2

(12) United States Patent
Lee et al.

(10) Patent No.: US 12,665,500 B2
(45) Date of Patent: Jun. 23, 2026

(54) POWER CONVERTER APPARATUS FOR VEHICLE

(71) Applicants: Hyundai Motor Company, Seoul (KR); Kia Corporation, Seoul (KR)

(72) Inventors: Sang Hun Lee, Taebaek-si (KR); Moon Jo Kang, Seoul (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 527 days.

(21) Appl. No.: 17/881,104

(22) Filed: Aug. 4, 2022

(65) Prior Publication Data

US 2023/0045813 A1      Feb. 16, 2023

(30) Foreign Application Priority Data

Aug. 11, 2021      (KR) ........................ 10-2021-0106059

(51) Int. Cl.
| | |
|---|---|
| *H02M 3/00* | (2006.01) |
| *H02M 1/32* | (2007.01) |
| *H02M 1/44* | (2007.01) |
| *H05K 7/20* | (2006.01) |

(52) U.S. Cl.
CPC ........... *H02M 3/003* (2021.05); *H02M 1/327* (2021.05); *H02M 1/44* (2013.01); *H05K 7/2049* (2013.01); *H05K 7/209* (2013.01)

(58) Field of Classification Search
CPC ........ H02M 3/003; H02M 1/327; H02M 1/44; H02M 7/003; H05K 7/2049; H05K 7/209; H05K 7/20927; G06F 1/20
See application file for complete search history.

(56) References Cited

U.S. PATENT DOCUMENTS

| | | | | |
|---|---|---|---|---|
| 10,971,431 | B2 * | 4/2021 | Yamauchi ............. | H02M 7/003 |
| 12,041,748 | B2 * | 7/2024 | Kang .................. | F28D 1/05358 |
| 2006/0119512 | A1 * | 6/2006 | Yoshimatsu ............. | H01Q 3/26 |
| | | | | 342/372 |
| 2009/0016021 | A1 * | 1/2009 | Kim ................... | H05K 7/20863 |
| | | | | 363/141 |

(Continued)

FOREIGN PATENT DOCUMENTS

| | | |
|---|---|---|
| JP | 2021-112011 A | 8/2021 |
| KR | 10-0998810 B1 | 12/2010 |

(Continued)

OTHER PUBLICATIONS

"Alternately." Merriam-Webster.com Dictionary, Merriam-Webster, https://www.merriam-webster.com/dictionary/alternately. Accessed Jan. 14, 2025. (Year: 2025).*

(Continued)

*Primary Examiner* — Jayprakash N Gandhi
*Assistant Examiner* — Matthew Sinclair Muir
(74) *Attorney, Agent, or Firm* — Morgan, Lewis & Bockius LLP

(57) ABSTRACT

A power converter apparatus includes a power module assembly including a power module and a cooler overlapping with the power module to allow the cooler to cover both sides of the power module, and a capacitor and a low voltage direct-current (DC)-DC converter (LDC) which are coupled in a state of pressing the power module assembly on both sides of the power module assembly.

8 Claims, 6 Drawing Sheets

(56)                    References Cited

U.S. PATENT DOCUMENTS

| 2012/0069529 A1* | 3/2012 | Chen ..................... H01L 23/552 |
| | | 361/729 |
| 2015/0311836 A1* | 10/2015 | Yoon ........................ H02P 6/14 |
| | | 318/400.26 |
| 2015/0328993 A1* | 11/2015 | Shin ................... H05K 7/20927 |
| | | 307/10.1 |
| 2016/0322155 A1* | 11/2016 | Bailey ................... H01F 27/366 |
| 2016/0332524 A1* | 11/2016 | Yoon ..................... H02M 7/003 |
| 2018/0145605 A1* | 5/2018 | Park ........................ B60L 3/003 |
| 2019/0148973 A1* | 5/2019 | Kim ......................... H02J 7/06 |
| | | 320/109 |
| 2019/0275895 A1* | 9/2019 | Jeong ................... B60L 3/0046 |
| 2019/0304872 A1* | 10/2019 | Onaga ..................... H05K 9/00 |

FOREIGN PATENT DOCUMENTS

| KR | 10-1510056 B1 | 4/2015 |
| KR | 10-2018-0058311 A | 6/2018 |
| KR | 10-2019-0105913 A | 9/2019 |

OTHER PUBLICATIONS

"Cooler." Merriam-Webster.com Dictionary, Merriam-Webster, https://www.merriam-webster.com/dictionary/cooler. Accessed Aug. 7, 2025. (Year: 2025).*
Office Action issued Jul. 27, 2025 in corresponding Korean Patent Application No. 10-2021-0106059.

* cited by examiner

FIG. 2

POWER CONVERTER APPARATUS FOR VEHICLE

CROSS REFERENCE TO RELATED APPLICATION

The present application claims priority of Korean Patent Application No. 10-2021-0106059 filed on Aug. 11, 2021, the entire contents of which is incorporated herein for all purposes by this reference.

TECHNICAL FIELD

The present disclosure relates to a power converter apparatus for vehicle, in which a power module, a capacitor, and a low voltage direct-current (DC)-DC converter (LDC), which implement an inverter used in an eco-friendly vehicle, are implemented in the form of one assembly.

BACKGROUND

An eco-friendly vehicle is a vehicle which drives a motor, which is an electric rotating mechanism, using electric energy stored in a battery, thereby generating power.

The eco-friendly vehicle includes an inverter having a switching element for converting direct-current (DC) power of the battery into alternating-current (AC) power having a plurality of phases required for driving the motor, and a low voltage direct-current (DC)-DC converter (LDC) for converting high voltage power stored in the battery into a low voltage for electrical and electronic load power supply.

The inverter includes a high-capacity capacitor which filters the power input from the battery. In addition, a switching element of the inverter is implemented in the form of a power module in which an insulated gate bipolar transistor (IGBT), a field effect transistor (FET), and a diode are packaged.

As described above, the capacitor, the power module, and the LDC, which are components constituting the inverter, may be each provided in a vehicle in a structure of being separated from each other as an individual device and may be integrated in the form of one assembly so as to secure an arrangement space of other components in the vehicle and efficiently cool each component.

In the field of technology, a new structural power converter apparatus for a vehicle is required, which is capable of integrating components for power conversion required in vehicles, such as capacitors, power modules, and LDCs, in the form of one assembly to efficiently cool each individual component, thereby maximizing performance of each component.

The foregoing is intended merely to aid in the understanding of the background of the present disclosure, and is not intended to mean that the present disclosure falls within the purview of the related art that is already known to those skilled in the art.

SUMMARY

Accordingly, the present disclosure has been made keeping in mind the above problems occurring in the related art, and the present disclosure is intended to propose a power converter apparatus for a vehicle, which is capable of compactly integrating power conversion components required for eco-friendly vehicles, such as capacitors, power modules, and low voltage direct-current (DC)-DC converters (LDCs), in the form of one assembly, improving vehicle mountability, improving operation stability and assembly through a solid and easy connection structure between the power conversion components, reducing a size and a weight, and improving an output density.

According to one aspect, a power converter apparatus for a vehicle includes a power module assembly including a power module and a cooler overlapping with the power module to allow the cooler to cover both sides of the power module, and a capacitor and a low voltage direct-current (DC)-DC converter (LDC) which are coupled in a state of pressing the power module assembly on both sides of the power module assembly.

An LDC assembly plate, which is configured to block electromagnetic waves generated in the LDC and facilitate heat exchange between a heater of the LDC and the cooler of the power module assembly, may be interposed between the LDC and the power module assembly.

An engagement element may pass through the LDC, the power module assembly, and the capacitor to engage the LDC, the power module assembly, and the capacitor and to press the power module assembly by the LDC and the capacitor.

A gate board configured to drive the power module may be disposed below the power module assembly and the capacitor, and a control board configured to control the gate board may be disposed below the LDC and the gate board.

An engagement element may be mechanically coupled with the capacitor and the gate board, and the power module of the power module assembly may be coupled to the gate board to provide a mechanical connection and an electrical connection.

A board-to-board connector may connect between the LDC and the control board and between the gate board and the control board.

The LDC may be mechanically coupled to the control board and the gate board may be mechanically coupled to the control board through engagement elements.

The control board and the gate board may be disposed in parallel and spaced apart from each other, and the LDC and the power module may be vertically disposed with respect to the control board and the gate board.

The power module assembly may include a plurality of the coolers are disposed on the both sides of the power module to overlap the both sides thereof.

The power module and the cooler may be alternately disposed and overlap in a plurality of times.

The cooler may be in contact with the both sides of the power module.

BRIEF DESCRIPTION OF THE DRAWINGS

The above and other objects, features and other advantages of the present disclosure will be more clearly understood from the following detailed description when taken in conjunction with the accompanying drawings, in which:

FIG. 2 is an exploded perspective view illustrating a power module assembly of FIG. 1;

DETAILED DESCRIPTION OF THE DISCLOSURE

Figure 1:
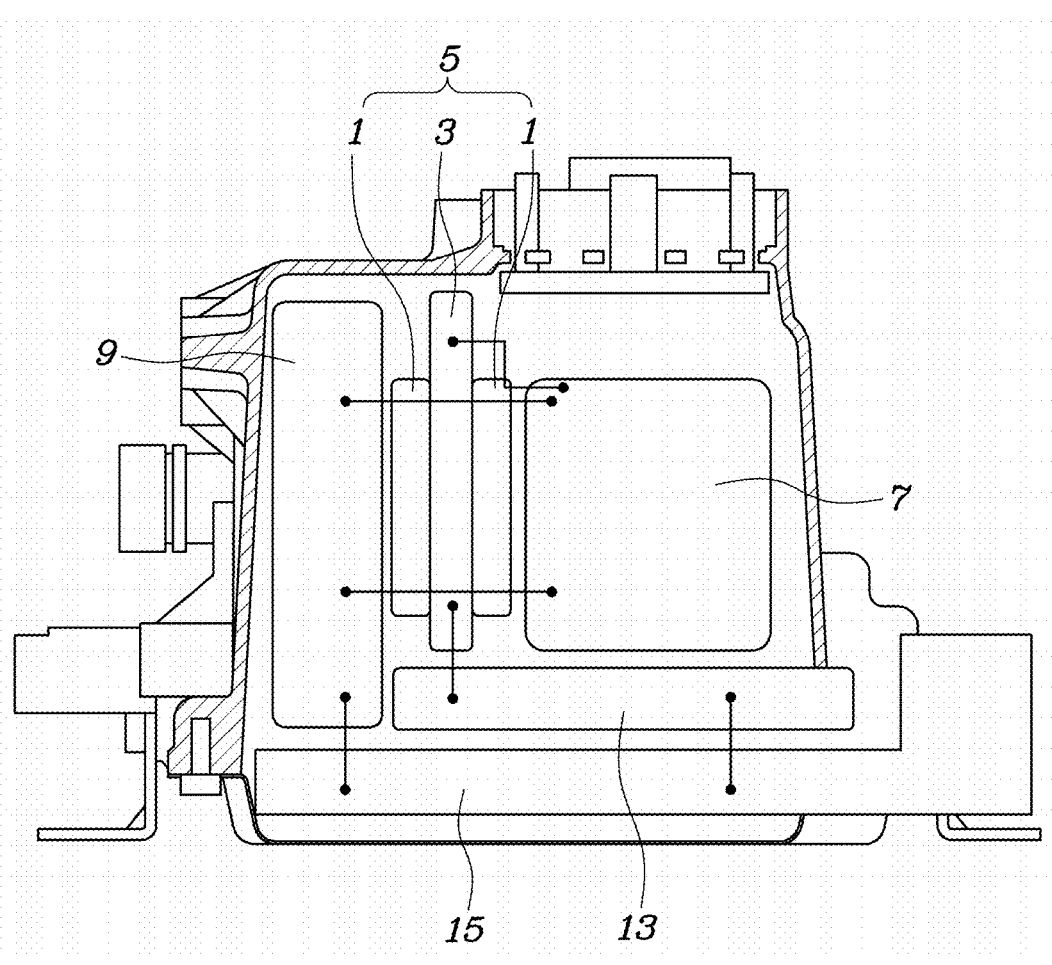
FIG. 1 is a diagram illustrating a first embodiment of a power converter apparatus for a vehicle according to the present disclosure.

Specific structural and functional descriptions of the embodiments of the present disclosure disclosed in this disclosure or application are illustrative only for the purpose of describing the embodiments, and the embodiments according to the present disclosure may be implemented in various forms and should not be construed as being limited to embodiments described in this disclosure or application.

The embodiments according to the present disclosure may be variously modified and may have various forms, so that specific embodiments will be illustrated in the drawings and be described in detail in this disclosure or application. It should be understood, however, that it is not intended to limit the embodiments according to the concept of the present disclosure to specific disclosure forms, but it includes all modifications, equivalents, and alternatives falling within the spirit and scope of the present disclosure.

The terms first, second, and/or the like may be used to describe various components, but the components should not be limited by these terms. These terms may be used only for the purpose of distinguishing one component from another component, and, for example, a first component may be referred to as a second element, and similarly, the second component may also be referred to as the first component without departing from the scope of the present disclosure.

When a component is referred to as being "connected," or "coupled" to another component, it may be directly connected or coupled to another component, but it should be understood that yet another component may exist between the component and another component. On the contrary, when a component is referred to as being "directly connected" or "directly coupled" to another, it should be understood that still another component may not be present between the component and another component. Other expressions describing the relationship between components, that is, "between" and "immediately between," or "adjacent to" and "directly adjacent to" should also be construed as described above.

Terms used herein is used only for the purpose of describing specific embodiments, and are not intended to limit the present disclosure. Unless the context clearly dictates otherwise, the singular form includes the plural form. In this disclosure, the terms "comprising," "having," or the like are used to specify that a feature, a number, a step, an operation, a component, an element, or a combination thereof described herein exists, and they do not preclude the presence or addition of one or more other features, numbers, steps, operations, components, elements, or combinations thereof.

Unless defined otherwise, all terms including technical or scientific terms used herein have the same meaning as commonly understood by those skill in the art to which the present disclosure pertains. General terms that are defined in a dictionary shall be construed to have meanings that are consistent in the context of the relevant art, and will not be interpreted as having an idealistic or excessively formalistic meaning unless clearly defined in this disclosure.

Hereinafter, preferred embodiments of the present disclosure will be described in detail with reference to the accompanying drawings. Like reference numerals denote like members throughout the drawings.

Referring to FIGS. 1 to 6, a power converter apparatus for a vehicle according to embodiments of the present disclosure includes, in common, a power module assembly 5 including a power module 3 and coolers 1, which overlap each other to expose the coolers 1 on both sides of the power module 3 (e.g., the coolers 1 cover both sides of the power module 3), and a capacitor 7 and a low voltage direct-current (DC)-DC converter (LDC) 9 which are coupled to both sides of the power module assembly 5 in a state of pressing the power module assembly 5.

That is, according to the present disclosure, the power module assembly 5 is formed such that the power module 3 and the coolers 1 overlap, and the capacitor 7 and the LDC 9 are coupled in the state of pressing the power module assembly 5.

In particular, in the power module assembly 5, the power module 3 and the coolers 1 overlap in a state in which the coolers 1 are exposed on the both sides of the power module 3. As described above, when the both sides of the power module 3 are coupled in a state of being pressed by the capacitor 7 and the LDC 9, the capacitor 7 and the LDC 9 are also in surface contact with the coolers 1 of the power module assembly 5 so that cooling is performed.

For reference, in the present embodiment, the cooler 1 is provided with a plurality of passages through which a refrigerant flows and is formed in a tube type which forms cooling planes on both sides of the cooler 1. However, the present disclosure is not limited thereto, and any cooler in the form of a flat plate, which forms cooling planes on the both sides, may be used. The power module 3 includes a packaged electronic component including an insulated gate bipolar transistor (IGBT), a field effect transistor (FET), and a diode.

Figure 2:
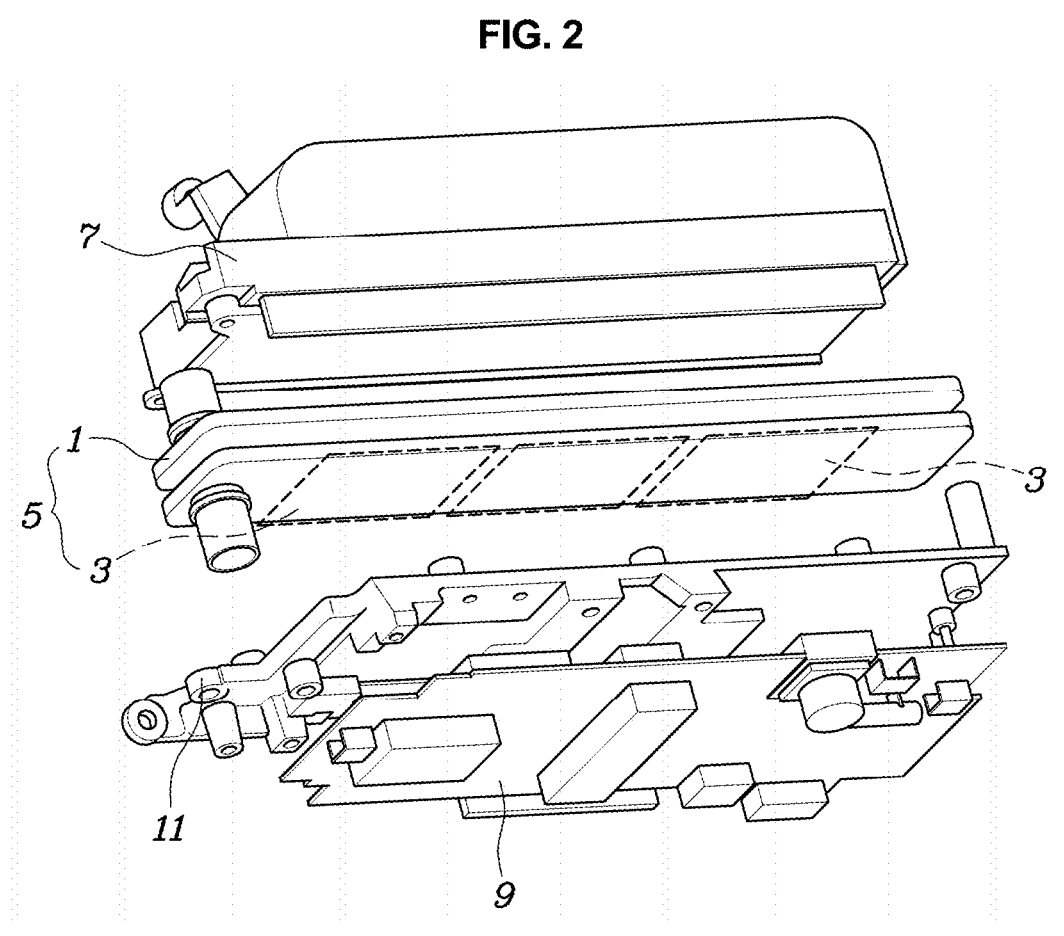

As can be seen from FIG. 2, in the present embodiment, an LDC assembly plate 11, which blocks electromagnetic waves generated from the LDC 9 and facilitates heat exchange between a heater of the LDC 9 and the cooler 1 of the power module assembly 5, is interposed between the LDC 9 and the power module assembly 5.

Therefore, it is not necessary to provide a separate blocking plate for blocking electromagnetic waves generated from the LDC 9, and the heater of the LDC 9 allows easier heat exchange with the cooler 1 so that the power converter apparatus for a vehicle may achieve weight reduction and compactness and stable operability may be secured and maintained.

In the power module assembly 5, the LDC 9 and the capacitor 7 are coupled in a state of pressing the power module assembly 5 through engagement elements for passing through the LDC 9, the power module assembly 5, and the capacitor 7 and engaging therewith.

Here, the engagement elements include bolts, rivets, pins, and the like and refer to elements capable of constraining a relative positional relationship of target coupling objects.

In addition, it should be understood that the engagement element passing through to be engaged with the capacitor 7 refers to that the engagement element substantially does not pass through the capacitor 7 and passes through a part forming a mechanical one body with the capacitor 7, such as a capacitor housing or a cover, which accommodates the capacitor 7 therein, or a structure integrally formed with the capacitor 7.

A gate board 13 for driving the power module 3 is disposed below the power module assembly 5 and the capacitor 7, and a control board 15 for controlling the gate board 13 is disposed below the LDC 9 and the gate board 13.

That is, an electrical connection relationship may be sequentially formed such that the gate board 13 is disposed above the control board 15, and the power module 3 is disposed above the gate board 13 so that the control board 15 controls the gate board 13 and the gate board 13 drives the power module 3.

Figure 3:
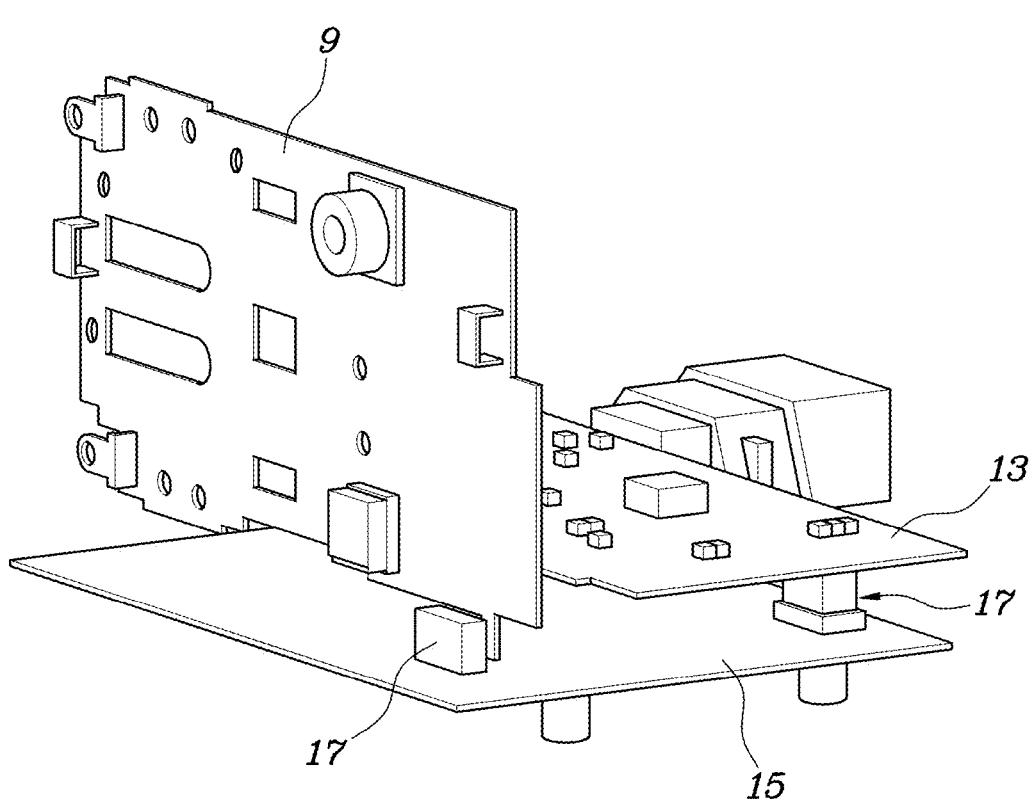
FIG. 3 is a diagram illustrating a low voltage direct-current (DC)-DC converter (LDC), a control board, and a gate board of FIG. 1.
Figure 4:
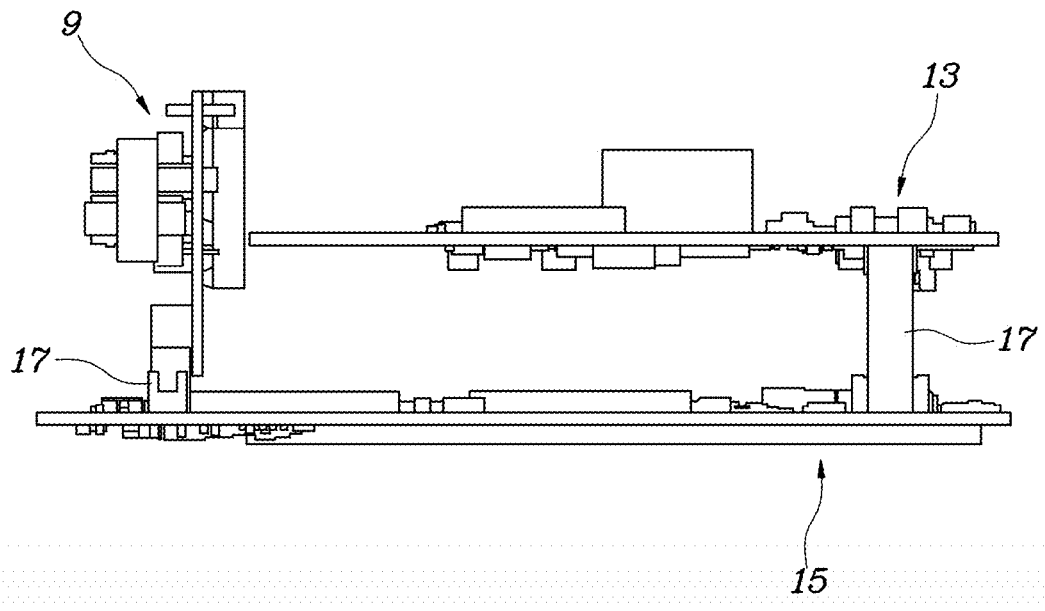
FIG. 4 is a front view of FIG. 3 that illustrates that the LDC, the control board, and the gate board are coupled to a board-to-board connector.

As shown in FIGS. 3 and 4, the control board 15 and the gate board 13 are disposed parallel to each other and spaced apart from each other. In addition, the LDC 9 and the power module 3 are vertically disposed with respect to the control board 15 and the gate board 13.

Accordingly, without additionally mounting a separate blocking plate for blocking the electromagnetic waves from the LDC 9, it is possible to secure stable operability of the control board 15 and the gate board 13.

A mechanical connection relationship is formed such that the LDC 9 is coupled to the control board 15 and the gate board 13 is coupled to the control board 15 through the engagement elements.

Here, the mechanical connection relationship being formed by the engagement elements refers to that two objects are connected to be mutually constrained, and thus the two objects are fixed to not occur relative motion with each other. For example, in a state in which a spacer is interposed between the control board 15 and the gate board 13, the control board 15 and the gate board 13 are engaged using an engagement element such as a bolt so that a separation state between the control board 15 and the gate board 13 may be stably maintained.

For reference, straight lines connected by circular points of both ends in FIG. 1 refer to that, the mechanical connection relationship is formed by the above-described engagement elements.

The capacitor 7 and the gate board 13 are coupled by the engagement element to form a mechanical connection relationship, and the power module 3 of the power module assembly 5 is coupled to form an electrical connection to the gate board 13 while forming a mechanical connection thereto.

Here, for example, the power module 3 forming the mechanical connection relationship to the gate board 13 while forming the electrical connection relationship thereto refers to that a terminal pin of the power module 3 is fixed to the gate board 13 by soldering or the like, and thus the electrical connection relationship between the gate board 13 and the power module 3 is formed through the terminal pin and the mechanical connection relationship is formed such that the relative motion between the power module 3 and the gate board 13 is suppressed due to a mechanical rigidity provided by the terminal pin.

The LDC 9 is coupled to the control board 15 and the gate board 13 is coupled to the control board 15 through a board-to-board connector 17.

That is, in addition to the formation of the mechanical connection relationship by the above-described engagement elements between the LDC 9 and the control board 15 and between the gate board 13 and the control board 15, an electrical connection relationship by the board-to-board connector 17 is also formed.

As described above, when compared that a wiring harness connects therebetween, the board-to-board connector 17 connects between the LDC 9 and the control board 15 and between the gate board 13 and the control board 15 so that excellent assemblability and excellent operational stability may be secured.

As described above, according to the present disclosure, since the electrical and electronic components constituting the power converter apparatus for a vehicle are mutually constrained due to their own mechanical connection relationship, a separate housing for securing a structural rigidity is not required so that a size and a weight of the power converter apparatus for a vehicle may be reduced.

Figure 5:
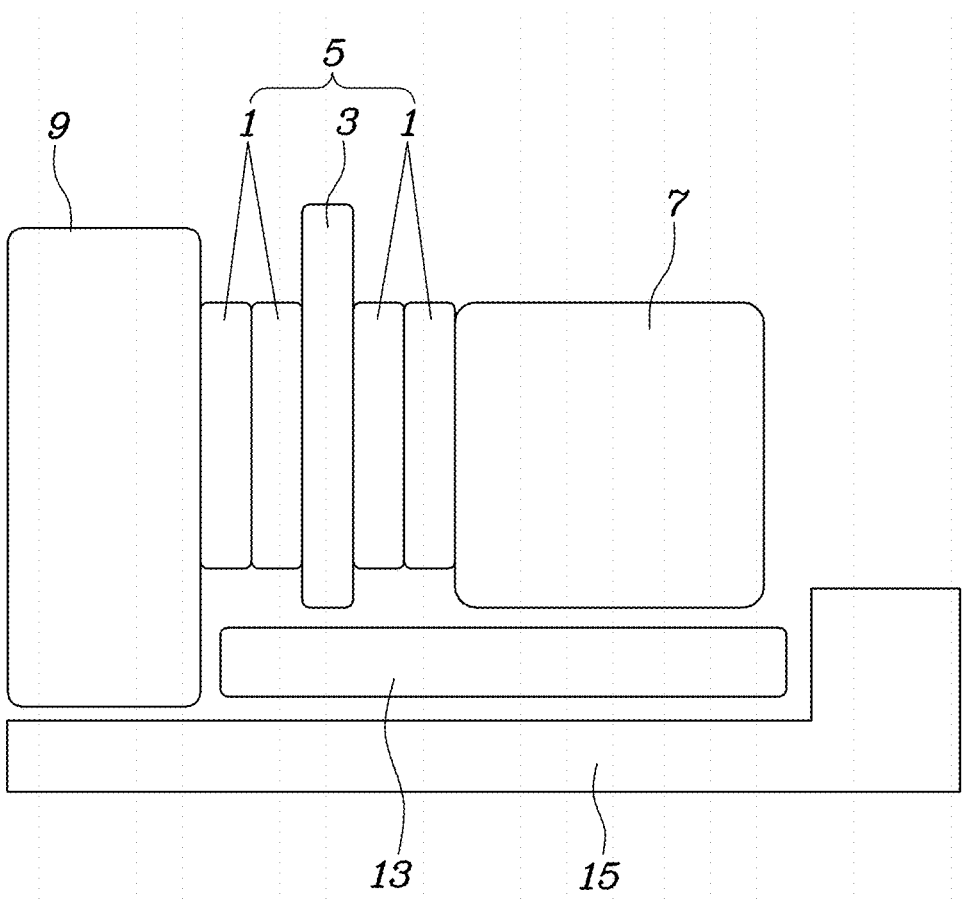
FIG. 5 is a diagram illustrating a second embodiment of a power converter apparatus for a vehicle according to the present disclosure.

FIG. 5 is a diagram illustrating a second embodiment of the present disclosure, and a power module assembly 5 is formed such that a plurality of the cooler 1 are disposed to overlap both sides of a power module 3 based on the power module 3.

That is, when an amount of heat generated from the power module 3, an LDC 9, and a capacitor 7 is higher than an amount of heat in the first embodiment of FIG. 1 and thus additional cooling performance is required, by overlapping the plurality of coolers 1 as in the second embodiment, thereby satisfying required cooling performance.

Figure 6:
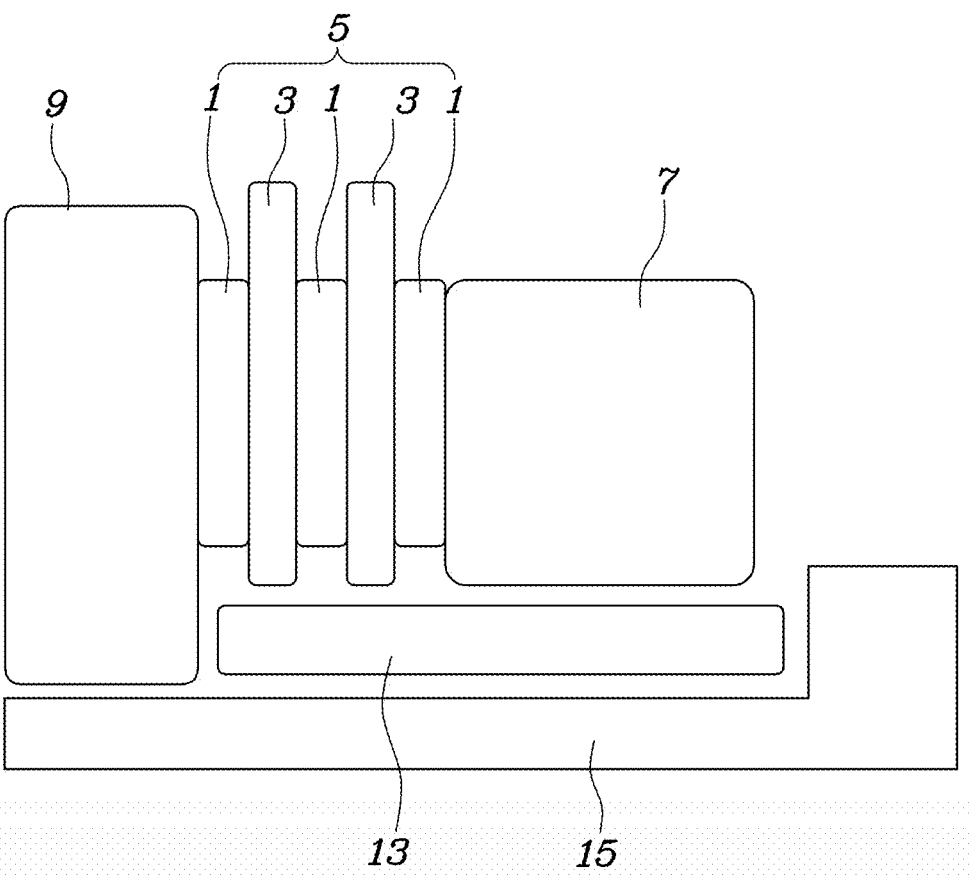
FIG. 6 is a diagram illustrating a third embodiment of a power converter apparatus for a vehicle according to the present disclosure.

FIG. 6 is a diagram illustrating a third embodiment of the present disclosure, and a power module assembly 5 is formed such that a power module 3 and a cooler 1 alternate to overlap in a plurality of times.

That is, as shown in FIG. 6, when a quantity of the power module 3 is increased, it is possible to respond to form the power module assembly 5 in the form in which the power module 3 and the cooler 1 alternate to overlap in a plurality of times.

In accordance with the present disclosure, there is provided a power converter apparatus for a vehicle, which is capable of compactly integrating power conversion components required for eco-friendly vehicles, such as capacitors, power modules, and low voltage direct-current (DC)-DC converters (LDCs), in the form of one assembly, improving vehicle mountability, improving operation stability and assembly through a solid and easy connection structure between the power conversion components, reducing a size and a weight, and improving an output density.

Although specific embodiments of the present disclosure have been described and illustrated, those skilled in the art will appreciate that various alternations and modifications are possible without departing from the technical spirit of the present disclosure as disclosed in the appended claims.

What is claimed is:

1. A power converter apparatus for a vehicle, comprising:
 a power module assembly including a power module, a first plurality of coolers disposed on one side of the power module to cover the one side of the power module and directly overlapping each other without any intervening elements, and a second plurality of coolers disposed on another side of the power module to cover the another side of the power module and directly overlapping each other without any intervening elements; and
 a capacitor and a low voltage direct-current (DC)-DC converter (LDC) which are coupled in a state of pressing the power module assembly on both sides of the power module assembly,
 wherein each of the first plurality of coolers and the second plurality of coolers is a liquid cold plate comprising a passage through which a refrigerant flows.

2. The power converter apparatus of claim 1, further comprising an LDC assembly plate, which is configured to block electromagnetic waves generated in the LDC and facilitate heat exchange between a heater of the LDC and either the first plurality of coolers or the second plurality of coolers of the power module assembly, interposed between the LDC and the power module assembly.

3. The power converter apparatus of claim 1, further comprising: an engagement element passing through the LDC, the power module assembly, and the capacitor to engage the LDC, the power module assembly, and the capacitor and to press the power module assembly by the LDC and the capacitor.

4. The power converter apparatus of claim 1, further comprising:

a gate board configured to drive the power module and disposed below the power module assembly and the capacitor; and a control board configured to control the gate board and disposed below the LDC and the gate board.

5. The power converter apparatus of claim 4, further comprising: an engagement element mechanically coupled with the capacitor and the gate board, wherein the power module of the power module assembly is coupled to the gate board to provide a mechanical connection and an electrical connection.

6. The power converter apparatus of claim 4, further comprising: a board-to-board connector connected between the LDC and the control board and between the gate board and the control board.

7. The power converter apparatus of claim 4, wherein the LDC is mechanically coupled to the control board and the gate board is mechanically coupled to the control board through engagement elements.

8. The power converter apparatus of claim 4, wherein:

the control board and the gate board are disposed in parallel and spaced apart from each other; and the LDC and the power module are vertically disposed with respect to the control board and the gate board.

\* \* \* \* \*